(12) United States Patent
Aherne

(10) Patent No.: US 8,829,975 B2
(45) Date of Patent: Sep. 9, 2014

(54) METHODS AND CIRCUITS FOR OPERATING A PARALLEL DMOS SWITCH

(71) Applicant: Analog Devices, Inc., Norwood, MA (US)

(72) Inventor: David Aherne, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/674,250

(22) Filed: Nov. 12, 2012

(65) Prior Publication Data

US 2013/0249620 A1 Sep. 26, 2013

Related U.S. Application Data

(60) Provisional application No. 61/613,260, filed on Mar. 20, 2012, provisional application No. 61/613,269, filed on Mar. 20, 2012.

(51) Int. Cl.
*H03K 17/06* (2006.01)

(52) U.S. Cl.
USPC ............ 327/383; 327/389; 327/404; 327/436

(58) Field of Classification Search
USPC ......... 327/379, 383, 389, 403, 404, 419, 427, 327/434, 436
See application file for complete search history.

(56) References Cited

U.S. PATENT DOCUMENTS

| 4,390,849 | A | * | 6/1983 | Miskin | 330/251 |
|---|---|---|---|---|---|
| 4,568,834 | A | | 2/1986 | Sherman et al. | |
| 4,686,383 | A | * | 8/1987 | Croft | 327/198 |
| 6,163,199 | A | | 12/2000 | Miske et al. | |
| 6,320,448 | B1 | | 11/2001 | Gantioler | |
| 6,509,781 | B2 | | 1/2003 | Dufort | |
| 6,731,151 | B1 | * | 5/2004 | Doutreloigne | 327/333 |
| 6,759,888 | B1 | | 7/2004 | Wodnicki | |
| 6,927,619 | B1 | | 8/2005 | Doyle | |
| 6,956,426 | B2 | * | 10/2005 | Wodnicki | 327/382 |
| 7,521,984 | B2 | * | 4/2009 | Ricotti | 327/427 |
| 7,808,222 | B2 | * | 10/2010 | Ueunten | 323/271 |
| 7,952,419 | B1 | | 5/2011 | Birk | |
| 8,427,235 | B2 | * | 4/2013 | Williams | 330/251 |
| 2005/0285665 | A1 | | 12/2005 | Donaldson et al. | |
| 2008/0067325 | A1 | | 3/2008 | Tani et al. | |

(Continued)

FOREIGN PATENT DOCUMENTS

JP 2000-353944 A 12/2000

OTHER PUBLICATIONS

PCT International Search Report and Written Opinion for PCT/US2013/31497 mailed on Jun. 19, 2013.

(Continued)

*Primary Examiner* — William Hernandez
(74) *Attorney, Agent, or Firm* — Kenyon & Kenyon, LLP

(57) ABSTRACT

A method and corresponding circuits for operating a parallel DMOS switch that includes a pair of P-type DMOS devices connected in series with each other and in parallel with a pair of N-type DMOS devices connected in series with each other. The method and circuits involve turning the switch on by applying gate signals to the DMOS device pairs which are generated using at least one source voltage of a DMOS device pair. The switch is turned off by setting the gate signals equal to the respective source voltages of the DMOS device pairs.

22 Claims, 6 Drawing Sheets

(56) References Cited

U.S. PATENT DOCUMENTS

| | | |
|---|---|---|
| 2010/0164582 A1 | 7/2010 | Ricotti et al. |
| 2010/0237816 A1 | 9/2010 | Seki et al. |
| 2011/0018508 A1 | 1/2011 | Ueunten |
| 2011/0148506 A1* | 6/2011 | Korec et al. ............... 327/434 |
| 2012/0086499 A1 | 4/2012 | Husain et al. |
| 2012/0299637 A1 | 11/2012 | Company Bosch et al. |

OTHER PUBLICATIONS

PCT International Search Report and Written Opinion for PCT/US2013/31248 mailed on Jun. 5, 2013, 8 pages.

* cited by examiner

METHODS AND CIRCUITS FOR OPERATING A PARALLEL DMOS SWITCH

CROSS-REFERENCE TO RELATED APPLICATIONS

This application claims the benefit, under 35 U.S.C. §119 (e), of U.S. Provisional Patent Application No. 61/613,269 and U.S. Provisional Patent Application No. 61/613,260, both filed on Mar. 20, 2012, the contents of which are hereby incorporated by reference in its entirety. This application is also related to U.S. patent application Ser. No. 13/592,692, filed Aug. 23, 2012.

BACKGROUND INFORMATION

DMOS devices have a restriction that the maximum gate-to-source voltage (Vgs) allowed is much less than the allowed drain-to-source voltage Vds. Typically, DMOS devices have a maximum allowable Vgs of approximately 5.5 V, although the maximum allowable voltage can vary depending on the manufacturing process used. This means that the gate voltage of the switches must be referenced to the source voltage (midp & midn in FIGS. 3 and 4). The source voltage tracks the external voltage applied to the drain of the DMOS devices via the inherent diode in the DMOS devices. To turn on the PDMOS devices the gate voltage must be a minimum of Vtp lower than midp and a maximum of 5.5 V lower than midp. To turn on the NDMOS devices the gate voltage must be a minimum of Vtn higher than midn and a maximum of 5.5 V higher than midn. This results in the need for a novel drive scheme to turn the Dmos devices on and off.

Another important specification for a switch is that the signal must be passed through the switch with as little distortion as possible (switch flatness/linearity) and as little current as possible should be lost while passing through the switch (minimal leakage).

SUMMARY

Example embodiments of the present invention relate to methods and corresponding circuits for operating a DMOS switch constructed using a pair of PDMOS devices connected in series with each other and/or a pair of NDMOS devices connected in series with each other. In one embodiment, the switch includes a pair of PDMOS devices connected in series with each other and in parallel with a pair of NDMOS devices connected in series with each other. A switch constructed in this manner is referred to herein as a "parallel DMOS switch."

Example embodiments of the present invention relate to methods and corresponding circuits for generating gate input voltages to drive (turn on) a DMOS switch. In one embodiment, the gate input voltages are generated using a single amplifier circuit. In another embodiment, the gate input voltages are generated using a dual-amplifier circuit.

In one embodiment, gate signals for both DMOS device pairs in a parallel DMOS switch are derived from a source voltage (midp or midn) of a single DMOS device pair. In an embodiment using midp as the source voltage, midp is passed through a unity gain buffer. When the switch is turned on midp=midn. From this buffered version of midp, voltage offsets equal to midp+5 V and midp−5 V are generated. These are then applied to the DMOS device gates, turning on both the PDMOS and NDMOS device pairs with a Vgs that tracks the externally applied voltage. This allows a rail-to-rail DMOS switch. Since a buffer is used leakage is minimized. It also has the added benefit that a constant Vgs is applied to the DMOS devices, resulting in an excellent switch flatness/linearity.

In another embodiment involving a parallel DMOS switch, gate signals are generated from both midp and midn and form the respective gate inputs of the DMOS device pairs respectively associated with midp and midn.

Example embodiments of the present invention relate to methods and corresponding circuits for turning off a DMOS switch. In one embodiment, the switch is turned off by tying each gate of the DMOS device pairs in the switch to signals that reflect the respective source voltages of the DMOS device pairs, resulting in 0 V Vgs.

Above Vdd−Vtn the NDMOS device pair is off and only the PDMOS device pair is conducting so the Ron is increased. Below Vss+Vtp the PDMOS device pair turns off and only the NDMOS device pair is conducting, resulting in a higher Ron. When the Ron increases near the supply rails the flatness/linearity specification is degraded.

To turn the parallel DMOS switch off the gate of the PDMOS device pair is tied to midp and the gate of the NDMOS device pair is tied to midn, resulting in 0 V Vgs.

DETAILED DESCRIPTION OF EXAMPLE EMBODIMENTS

Figure 1:
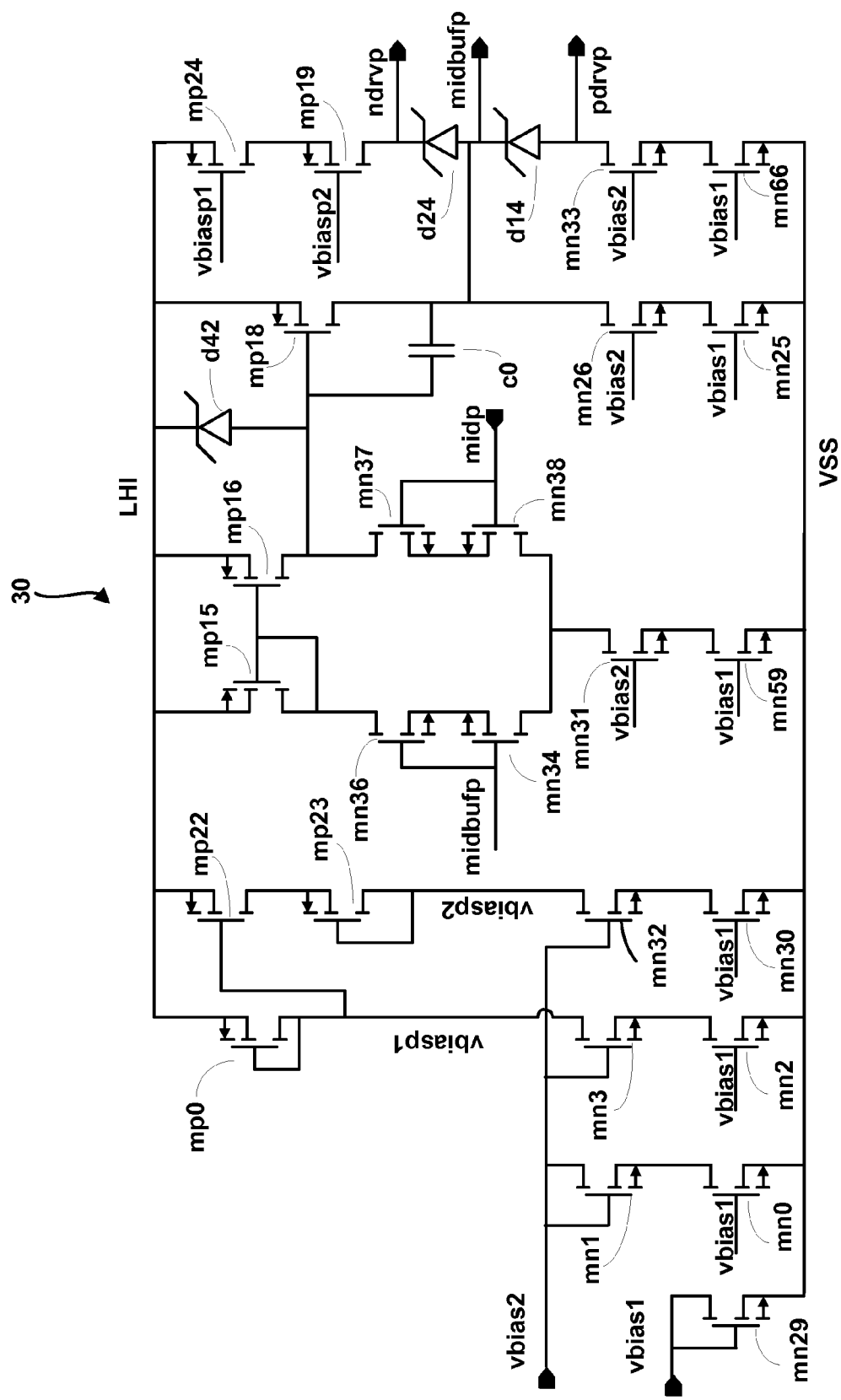
FIG. 1 shows an example embodiment of an amplifier circuit according to the present invention.

The present invention relates to methods and corresponding circuits for operating DMOS switches, including parallel DMOS switches. FIG. 1 shows an example embodiment of an amplifier circuit 30. The amplifier circuit 30 is a voltage follower circuit configured to provide unity gain, i.e., the amplifier operates as a voltage buffer.

The amplifier 30 may include a set of P-type MOS transistors mp0, mp22 and mp24 connected to a positive supply rail (LHI). The transistors mp0, mp22 and mp24 can be 5 V PMOS devices and provide positive current sources for the amplifier circuit 30.

The amplifier 30 may include a set of N-type MOS transistors mn29, mn0, mn2, mn30, mn59, mn25 and mn66 connected to a negative supply rail (VSS). The transistors mn29, mn0, mn2, mn30, mn59, mn25 and mn66 can be 5 V NMOS devices and provide negative current sources for the amplifier circuit 30.

The amplifier 30 may include a set of N-type cascode devices mn1, mn3, mn32, mn31, mn26 and mn33, which are NDMOS devices connected in series with respective ones of the 5 V NMOS devices to protect the NMOS devices from high voltages.

The amplifier 30 may include a set of P-type cascode devices mp23 and mp19, which are PDMOS devices connected in series with respective ones of the 5 V PMOS devices to protect the PMOS devices from high voltages.

The input to the amplifier circuit 30 is a source voltage of a DMOS device in the switch. In the embodiment shown in FIG. 1, the source voltage is obtained from a PDMOS device (e.g., midp in FIGS. 3 and 4). NDMOS devices mn36, mn34, mn37, mn38 form an input pair for the amplifier 30. Specifically, mn36 is connected in series with mn34 with a shared gate input midbufp, while mn37 and mn38 are connected in series with a shared gate input midp. In an alternative embodiment, the source voltage is obtained from an NDMOS device (e.g., midn in FIGS. 3 and 4). The amplifier output is a buffered version of the input that is used to generate a pair of control signals ndrvp and pdrvp for driving the switch. The output is also fed back into the amplifier circuit 30. For example, in FIG. 1, the output midbufp is fed back as an input to the amplifier circuit (e.g., to the gate of mn34). The amplifier includes a current mirror (mp15, mp16) to the positive supply rail (LHI) and a current source to the negative supply rail (Vss). Mn59 provides a current source connecting the input pair to Vss.

Mp15 and mp16 are PDMOS devices that form a current mirror at the top of the input pair and operate to maintain the same current in both branches (mn36/mn34 and mn37/mn38) of the input pair.

Mp18 is a PDMOS device that forms the output stage of the amplifier circuit 30. A compensation capacitor C0 connects the drain and the gate of mp18 to enhance output stability. A Zener diode d42 connects the source and the gate of mp18 to limit Vgs to 5 V.

The output midbufp is obtained from the drain of mp18 and connected between two Zener diodes d24 and d14. The diode d24 generates ndrvp from midbufp (i.e., midbufp+5 V) and the diode d14 generates pdrvp from midbufp (i.e., midbufp−5 V). However, there are many alternative devices suitable for generating the voltages ndrvp and pdrvp, e.g., using a diode stack, a resistor or a set of diode-connected MOS devices.

By providing a unity gain, the amplifier circuit 30 enables the parallel DMOS switch to be driven by a signal obtained from the parallel DMOS switch (e.g., midp), without interfering with the signal in the DMOS switch. Ndrvp and pdrvp are generated from the buffered version of the signal (i.e., from midbufp rather than directly from midp).

Vbias1 and vbias2 are bias voltages that control the amount of current flowing through various devices in the amplifier circuit 30 that can be scaled up and down to meet the performance requirements of the amplifier circuit (e.g., amplifier slew rate). Vbiasp1 and vbiasp2 denote the voltages at the drains of mp0 and mp23, respectively, and are derived from the currents generated by applying vbias1 to the gates of mn2 and mn30 and applying vbias2 to the gates of mn3 and mn32. Vbiasp1 and vbiasp2 are applied as respective gate inputs of the transistors mp24 and mp19, thereby mirroring the vbias1 and vbias2 currents, which are applied as respective gate inputs of the transistors mn66 and mn33.

Figure 2:
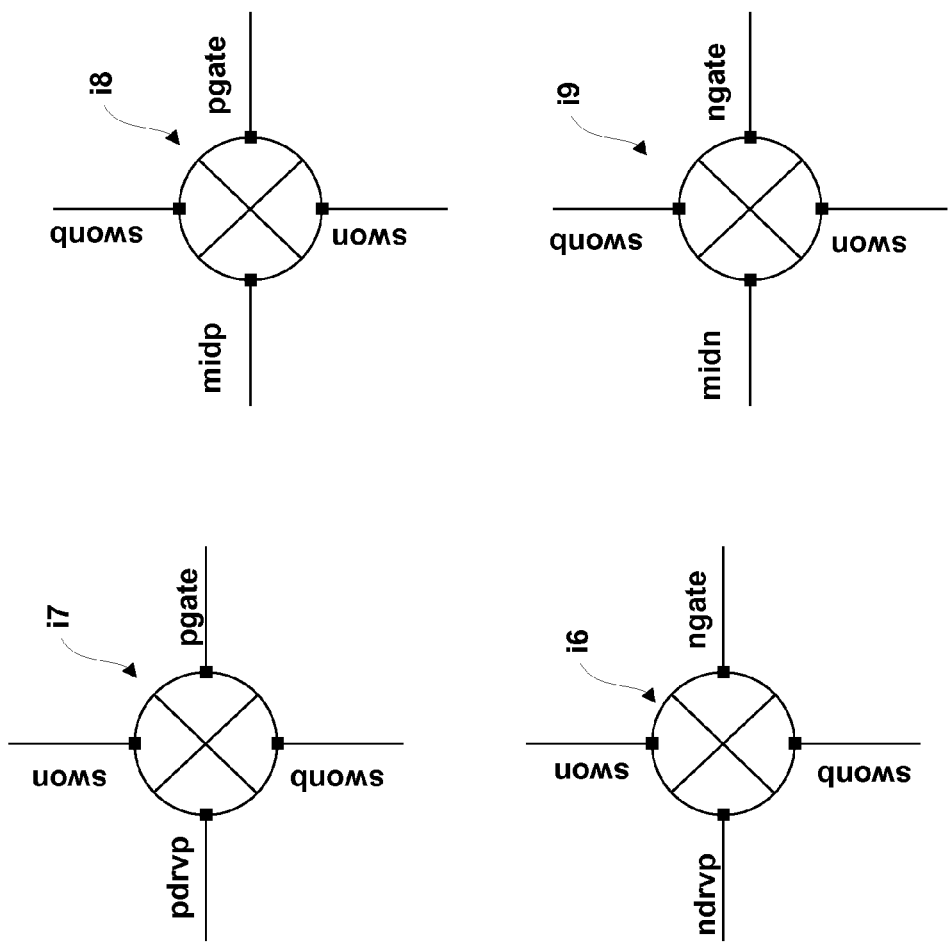
FIG. 2 shows an example embodiment of a set of transmission gates for turning a parallel Dmos switch on and off in accordance with the present invention.

FIG. 2 shows an example embodiment of a set of transmission gates i6, i7, i8 and i9 for transmitting control signals for turning the parallel DMOS switch on and off, in accordance with the present invention. The control signals may be generated by a suitable control arrangement, which would be known to one of ordinary skill in the art. The transmission gates in FIG. 2 may be used in conjunction with any of the amplifier circuits or parallel DMOS switches discussed herein. To turn the parallel DMOS switch on, control signals swon and swonb (the complement of swon) close, i.e., render conducting, the transmission gates i6 and i7 to connect ndrvp to ngate and pdrvp to pgate, while simultaneously opening (i.e., render non-conducting) the transmission gates i8 and i9. To turn the parallel DMOS switch off, control signals swon/swonb close the transmission gates i8/i9 to connect midn to ngate and midp to pgate, while simultaneously opening transmission gates i6 and i7, thereby providing Vgs=0.

The transmission gates i6 to i9 allow the amplifier circuit to continue tracking midp while the parallel DMOS switch is turned off, since ndrvp/pdrvp is isolated from the parallel DMOS switch. This allows faster turn on of the parallel DMOS switch when required.

In an alternative embodiment, ndrvp and pdrvp may be connected directly to the gates of the parallel DMOS switch, without using transmission gates i6 to i9. For example, the amplifier circuit 30 could be turned off so that ndrvp and pdrvp are floating. A suitable control arrangement may be provided for floating the amplifier circuit 30, e.g., the same control arrangement that generates the control signals applied to the transmission gates i6, i7, i8 and i9. Alternatively, other circuit arrangements may be used to isolate ndrvp and pdrvp from the gates of the parallel DMOS switch without turning the amplifier circuit off. For example, in FIG. 1, mp19 could be turned off by disconnecting its gate from vbiasp2 and connecting its gate to LHI. mn33 could be turned off by disconnecting its gate from vbias2 and connecting it to VSS. This would float ndrvp and pdrvp. The switch could then be turned off by connecting midp to pgate and midn to ngate. A diode stack would also need to be used in place of d24 to prevent a forward biased diode current path from midbufp to ndrvp.

Figure 3:
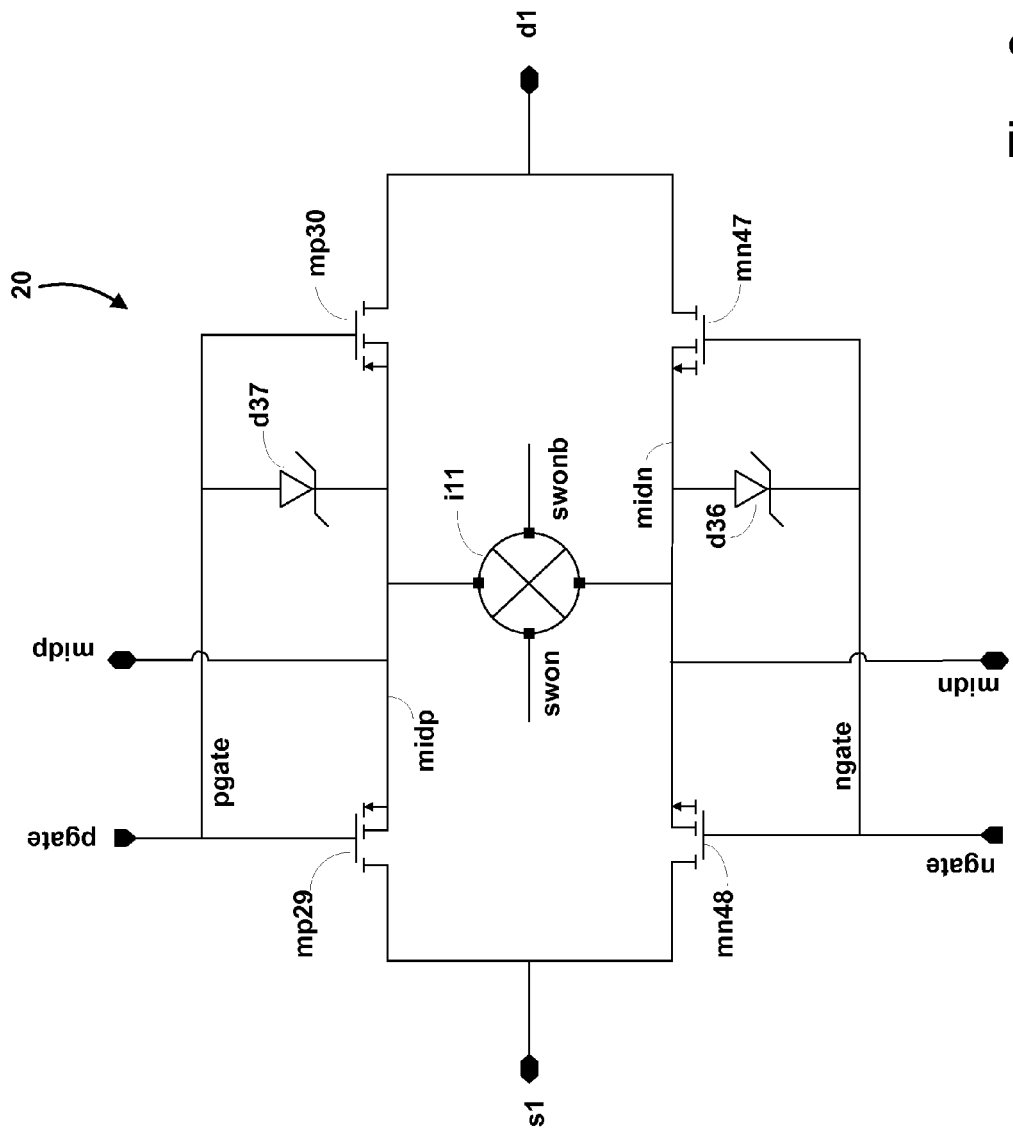
FIG. 3 shows an example embodiment of a parallel DMOS switch according to the present invention.
Figure 4:
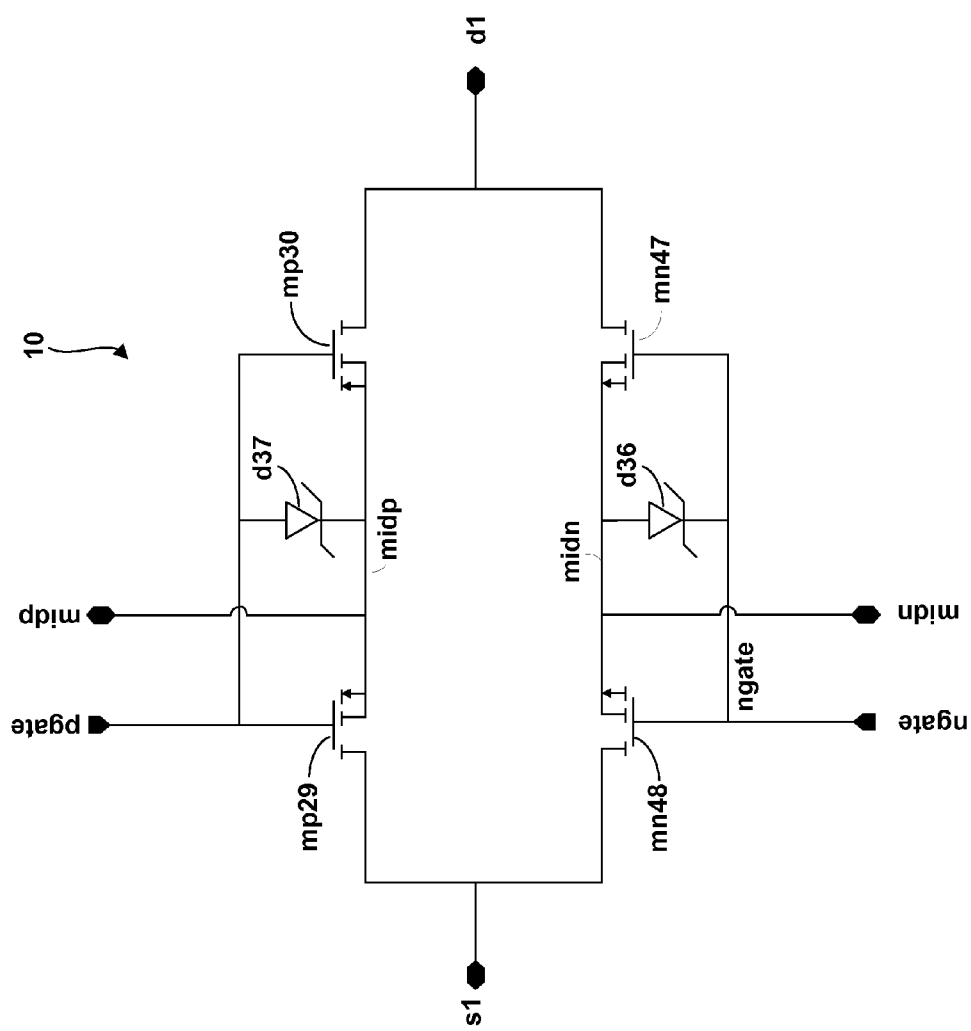
FIG. 4 shows an example embodiment of a parallel DMOS switch 10 according to the present invention.

Exemplary embodiments of parallel DMOS switches are shown in FIGS. 3 and 4. The switches in FIGS. 3 and 4 may be used in conjunction with any of the amplifier circuits discussed herein, including the single amplifier 30 in FIG. 1 and the dual amplifier circuit described below in connection with FIGS. 5A and 5B.

FIG. 3 shows an example embodiment of a parallel DMOS switch 20 according to the present invention. The switch 20 is similar in structure to the parallel DMOS switch described in U.S. patent application Ser. No. 13/592,692 filed on Aug. 23, 2012, the contents of which are hereby incorporated by reference in its entirety. The switch 20 may be used in conjunction with the circuits in FIGS. 1 and 2. Unlike the switch in U.S. patent application Ser. No. 13/592,692, the switch 20 includes a transmission gate i11 that couples midp to midn at the same time that the switch 20 is turned on. This ensures that midp is equal to midn, and allows pdrvp and ndrvp to be generated from the same signal (e.g., from midp as shown in FIG. 1, or alternatively from midn).

FIG. 4 shows an example embodiment of a parallel DMOS switch 10 according to the present invention. The switch 10 is the same as the switch in U.S. patent application Ser. No. 13/592,692, and does not include a transmission gate to couple midp to midn. The additional transmission gate is not necessary because even if midp and midn are not equal while the switch 10 is turned off, when the switch 10 is turned on, the amplifier will force them to be approximately equal. If only midp is used to generate ndrvp then it is likely that when ndrvp is connected to ngate, ngate will be forced to greater than 5 V higher than midn. For a short duration afterwards, zener diode d36 may breakdown and keep midn at a maximum of 5 V less than ngate. Since ngate is higher than midn, mn48 and mn47 will turn on, midn will then be substantially equal to midp and zener diode d36 will come out of breakdown. The switch is now on and will work as normal.

The switch 10 is operational over a range of source voltages. If midn is less than 5 V lower than ngate the switch 10 will turn on as normal. If midn is greater than 5 V lower than ngate the zener diode d36 will breakdown and pull midn to less than 5 V below ngate. The switch 10 will turn on even if midn is greater than 5 V below ngate, but would be damaged if Vgs exceeded the maximum allowable voltage. midn can only go 0.7 V above the most negative of s1 or d1 due to the parasitic diodes from midn to s1 and midn to d1. Ndrvp will always be 5 V greater than the most positive of s1 or d1 so will always be less than or equal to 4.3 V higher than midn.

Figure 5A:
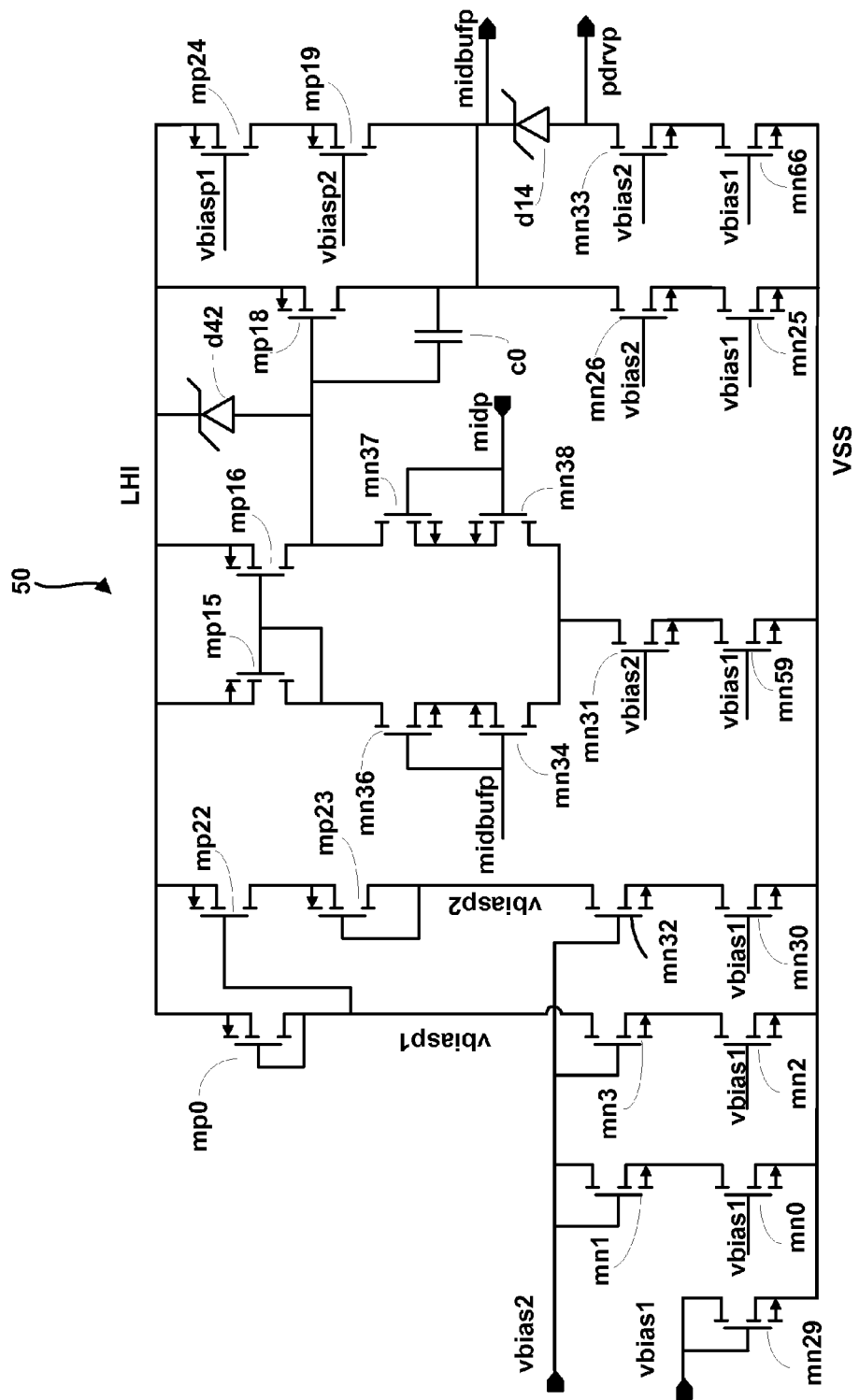
FIG. 5A shows a first portion 50 of an example embodiment of a dual amplifier circuit according to the present invention.
Figure 5B:
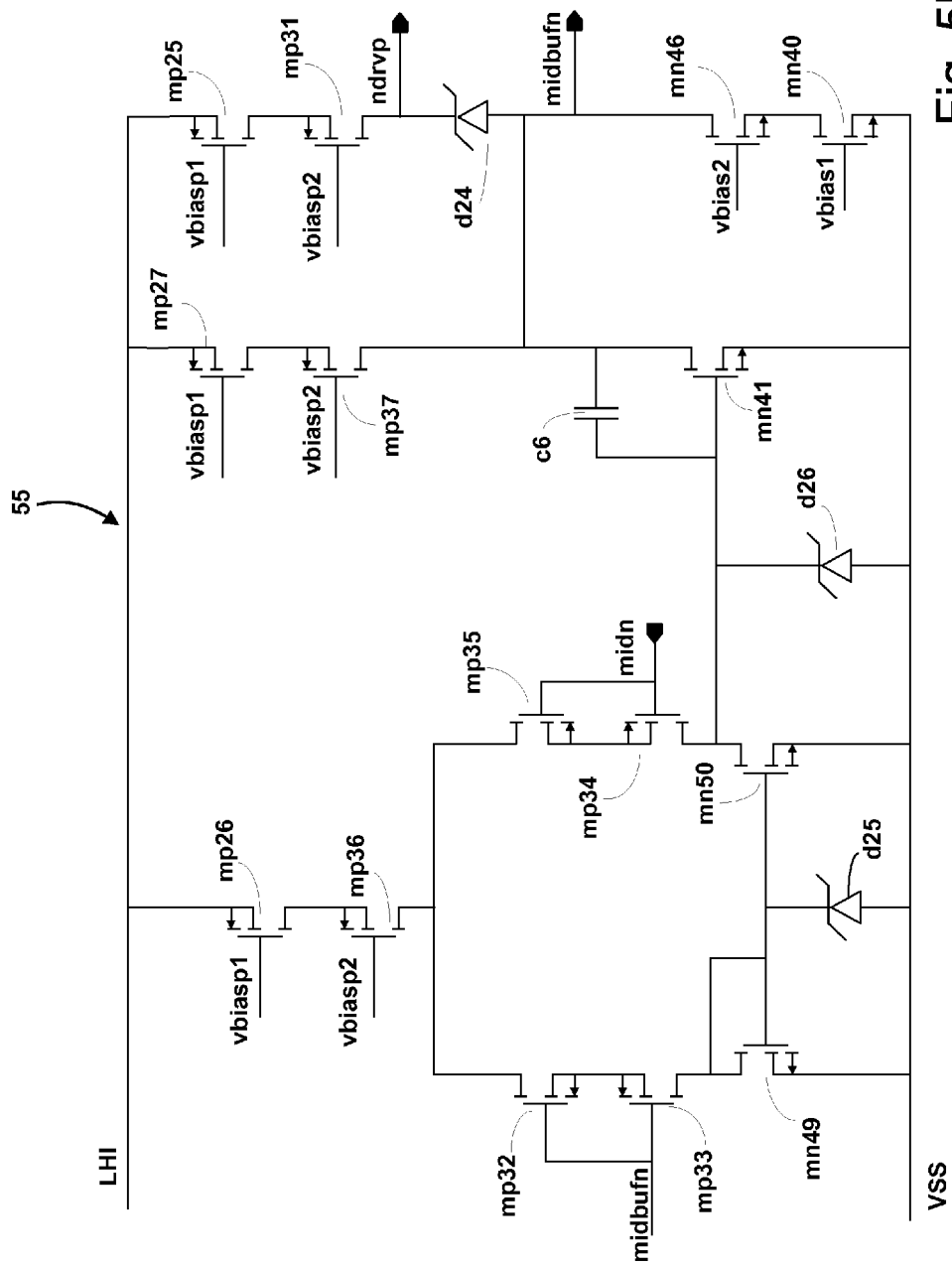
FIG. 5B shows a second portion 55 of the example dual amplifier circuit in FIG. 5A.

FIG. 5A shows a first portion 50 of an example embodiment of a dual amplifier circuit according to the present invention. FIG. 5B shows a second portion 55 of the example dual amplifier circuit in FIG. 5A. The portion 50 is similar to the amplifier circuit 30 in FIG. 1, except that the circuitry has been modified so that ndrvp is no longer generated based on midbufp. Instead, ndrvp is generated based on midbulh, by a second amplifier, e.g., the second portion 55 in FIG. 5B. Accordingly, the zener diode d24 has been moved to the second portion 55, which includes devices for receiving midbufn and midn as inputs. Thus, in accordance with one embodiment of the present invention, a parallel DMOS switch can be controlled based on signals obtained from the sources of a NDMOS device and a PDMOS device in the DMOS switch.

The portion 55 forms a complementary amplifier in which the input devices (e.g., mp32 to mp35) are PDMOS, the current sources (e.g., mp25 to mp27) are at the top (i.e., connected to the positive supply rail LHI as opposed to VSS in FIG. 1), the current mirror (e.g., mn49 and mn50) is at the bottom, and the output device (e.g., mn41) is NDMOS.

The portion 55 includes a set of P-type MOS transistors, e.g., 5 V PMOS transistors mp25, mp26, mp27 that provide positive current sources. The portion 55 also includes a set of N-type MOS transistor, e.g., 5 V NMOS transistor mn40, that provide a negative current source. Similar to portion 50, the portion 55 may include P-type cascode devices (e.g., mp36, mp37 and mp31) to protect the PMOS devices from high voltages and an N-type cascode device (e.g., mn46) to protect an NMOS device (mn40) from high voltages.

As previously explained in connection with FIG. 1, mn36, mn34, mn37 and mn38, which are also present in FIG. 5a, form an input pair into which midp and midbufp are input. A complementary input pair exists in the portion 55 and is formed by the series connection of mp32 and mp33 and the series connection of mp34 and mp35. As shown in FIG. 5B, midn is input to the gates of mp34 and mp35, while midbufn (which is a buffered version of midn generated by the amplifier in FIG. 5B) is fed back into the amplifier as input to the gates of mp32 and mp33.

Mn49 and mn50 are NDMOS devices that form the current mirror at the bottom of the input pair and operate to maintain the same current in both branches (mp32/mp33 and mp34/mp35) of the input pair.

Mn41 is an NDMOS device that forms the output stage of the amplifier in FIG. 5B. A compensation capacitor C6 connects the drain and the gate of mn41 to enhance output stability. A Zener diode d26 connects the source and the gate of mn41 to limit Vgs to 5 V. Additional Zener diode d25 may also be provided for clamping Vgs to 5 V at other locations in the portion 55.

The output midbufn is obtained from the drain of mn41 and connected between Zener diode d24 and the drain of mn46. The diode d24 generates ndrvp from midbufn (i.e., midbufn+5 V), while the diode d14 in FIG. 5A generates pdrvp from midbufp (i.e., midbufp−5 V). However, there are many alternative devices suitable for generating the voltages ndrvp and pdrvp, e.g., using a diode stack, a resistor or diode-connected MOS devices.

Vbias1, vbias2, vbiasp1 and vbiasp2 are applied in the same manner as in FIG. 1. Specifically, vbias1 is the bias voltage to set the currents of the NMOS current sources; vbias2 is the bias voltage to turn on the NDMOS cascode devices; vbiasp1 is the bias voltage to set the currents of the PMOS current sources; and vbiasp2 is the bias voltage to turn on the PDMOS cascode devices.

In the preceding specification, the present invention has been described with reference to specific example embodiments thereof. Example embodiments of a single amplifier circuit (FIG. 1) and a dual amplifier circuit (FIGS. 5A and 5B) were described as suitable for use with a parallel DMOS switch, such as the example switches in FIGS. 3 and 4. An example embodiment of transmission gate circuitry (FIG. 2) for transmitting control signals from the example amplifier circuits to the example switches was also described. It will, however, be evident that various modifications and changes may be made thereunto without departing from the broader spirit and scope of the present invention as set forth in the claims that follow. For example, it may be possible to construct other amplifier circuits and control circuits for driving parallel DMOS switches in accordance with the principles of the present invention, which include: turning on a parallel DMOS switch in such a way that the maximum allowable Vgs is not exceeded for any of the DMOS devices in the switch; turning on a parallel DMOS switch by applying a gate signal generated using a source voltage of at least one DMOS device pair in the switch; turning off a parallel DMOS switch by setting Vgs equal to zero as a function of the source voltages of the DMOS device pairs; and setting Vgs equal to zero by tying the gates of the DMOS device pairs to the respective sources of the DMOS device pairs.

The example methods may also be used to operate conventional DMOS switches, e.g., two NDMOS devices in series or two PDMOS devices in series. For example, it is readily apparent that the example amplifier circuits can be modified to generate only one of ndrvp and pdrvp (e.g., by removing one of the Zener diodes d14 and d24 in FIG. 1) for driving a conventional DMOS switch.

The embodiments described herein may be presented combined with each other in various combinations. The specification and drawings are accordingly to be regarded in an illustrative rather than restrictive sense.

What is claimed is:

1. A method for operating a DMOS switch including a first DMOS device pair and a second DMOS device pair, the method comprising:
    turning on the switch by generating a respective gate signal of each DMOS device pair using a source voltage of a DMOS device pair in the switch,
    wherein:
        each gate signal is generated by processing a corresponding source voltage through an amplifier;
        the first DMOS device pair includes two NDMOS devices connected in series; and
        the second DMOS device pair includes two PDMOS devices connected in series.

2. The method of claim 1, wherein each amplifier is configured to provide unity gain for the corresponding source voltage being amplified, the method further comprising:
    generating each gate signal as a voltage offset of an amplified source voltage.

3. The method of claim 1, further comprising:
    controlling each amplifier such that each gate signal is floating whenever the switch is turned off.

4. The method of claim 1, further comprising:
generating a first gate signal by processing a source voltage obtained from the first DMOS device pair through a first amplifier; and
generating a second gate signal by processing a source voltage obtained from the second DMOS device pair through a second amplifier.

5. The method of claim 1, further comprising:
generating each gate signal using a respective voltage generating device, each voltage generating device selected from the group including a Zener diode, a diode stack and a set of diode-connected MOS devices.

6. A method for operating a DMOS switch including a first DMOS device pair and a second DMOS device pair, the method comprising:
turning on the switch by generating a respective gate signal of each DMOS device pair using a source voltage of a DMOS device pair in the switch; and
connecting a shared source terminal of the first DMOS device pair to a shared source terminal of the second DMOS device pair at the same time as turning the switch on,
wherein:
the first DMOS device pair includes two NDMOS devices connected in series; and
the second DMOS device pair includes two PDMOS devices connected in series.

7. A method for operating a DMOS switch including a first DMOS device pair and a second DMOS device pair, the method comprising:
turning on the switch by generating a respective gate signal of each DMOS device pair using a source voltage of a DMOS device pair in the switch,
wherein:
the first DMOS device pair includes two NDMOS devices connected in series;
the second DMOS device pair includes two PDMOS devices connected in series; and
the switch includes the first DMOS device pair connected in parallel with the second DMOS device pair.

8. The method of claim 7, further comprising:
generating each gate signal using a device that limits the gate signal to below a maximum allowable gate-to-source voltage of the respective DMOS device pair to which the gate signal is applied.

9. The method of claim 7, further comprising:
turning off the switch by setting each gate signal equal to the source voltage of the respective DMOS device pair to which the gate signal is applied.

10. The method of claim 9, wherein each gate signal is set by tying the gate of the respective DMOS device pair to the source of the respective DMOS device pair.

11. The method of claim 7, further comprising:
generating the respective gate signal of each DMOS device pair such that the gate signal turns on the switch without causing current to flow between a circuit that generates the gate signal and a shared connection terminal of the DMOS device pair.

12. A circuit for operating a DMOS switch including a first DMOS device pair and a second DMOS device pair, the circuit comprising:
an amplifier arrangement including at least one amplifier, the amplifier arrangement configured to generate a respective gate signal of each DMOS device pair using a source voltage of a DMOS device pair in the switch;
a control arrangement configured to turn the switch on by applying each gate signal generated by the amplifier arrangement to a gate input of a respective DMOS device pair,
wherein:
the first DMOS device pair includes two NDMOS devices connected in series; and
the second DMOS device pair includes two PDMOS devices connected in series.

13. The circuit of claim 12, wherein each amplifier is configured to provide unity gain for a respective source voltage being amplified, and to generate each gate signal as a voltage offset of an amplified source voltage.

14. The circuit of claim 12, wherein the control arrangement controls each amplifier such that each gate signal is floating whenever the switch is turned off.

15. The circuit of claim 12, wherein the at least one amplifier includes a first amplifier that processes a source voltage obtained from an NDMOS device in the switch and a second amplifier that processes a source voltage obtained from a PDMOS device in the switch.

16. The circuit of claim 12, further comprising:
a respective voltage generating device that generates each gate voltage, each voltage generating device selected from the group including a Zener diode, a diode stack and a set of diode-connected MOS devices.

17. The circuit of claim 12, wherein the amplifier arrangement includes devices that limit each gate signal to below a maximum allowable gate-to-source voltage of the respective DMOS device pair to which the gate signal is applied.

18. The circuit of claim 12, wherein the control arrangement is configured to turn off the switch by setting each gate signal equal to the source voltage of the respective DMOS device pair to which the gate signal is applied.

19. The circuit of claim 18, wherein the control arrangement is configured to set each gate signal by tying the gate of the respective DMOS device pair to the source of the respective DMOS device pair.

20. The circuit of claim 12, wherein the control arrangement is configured to connect a shared source terminal of the first DMOS device pair to a shared source terminal of the second DMOS device pair at the same time as turning the switch on.

21. The circuit of claim 12, wherein the switch includes the first DMOS device pair connected in parallel with the second DMOS device pair.

22. The circuit of claim 12, wherein the control arrangement applies the respective gate signal of each DMOS device pair such that the gate signal turns on the switch without causing current to flow between the amplifier arrangement and a shared connection terminal of the DMOS device pair.

* * * * *